US011373392B2

(12) United States Patent
Nittka et al.

(10) Patent No.: US 11,373,392 B2
(45) Date of Patent: Jun. 28, 2022

(54) SYSTEM AND METHOD FOR MAGNETIC RESONANCE FINGERPRINTING USING A PLURALITY OF PULSE SEQUENCE TYPES

(71) Applicants: Case Western Reserve University, Cleveland, OH (US); SIEMENS HEALTHCARE GMBH, Erlangen (DE)

(72) Inventors: Mathias Nittka, Cleveland, OH (US); Gregor Korzdorfer, Cleveland, OH (US); Peter Speier, Cleveland, OH (US); Mark A. Griswold, Shaker Heights, OH (US); Yun Jiang, Cleveland, OH (US)

(73) Assignees: Case Western Reserve University, Cleveland, OH (US); Siemens Healthcare GMBH, Erlangen (DE)

( * ) Notice: Subject to any disclaimer, the term of this patent is extended or adjusted under 35 U.S.C. 154(b) by 0 days.

(21) Appl. No.: 16/378,166

(22) Filed: Apr. 8, 2019

(65) Prior Publication Data
US 2019/0340463 A1 Nov. 7, 2019

Related U.S. Application Data
(60) Provisional application No. 62/653,737, filed on Apr. 6, 2018.

(51) Int. Cl.
*G01R 33/56* (2006.01)
*G01R 33/50* (2006.01)
(Continued)

(52) U.S. Cl.
CPC ............. *G06V 10/42* (2022.01); *G01R 33/50* (2013.01); *G01R 33/5608* (2013.01); *G06T 7/0012* (2013.01)

(58) Field of Classification Search
CPC .. G01R 33/482; G01R 33/4824; G01R 33/50; G01R 33/56; G01R 33/5608; G01R 33/5613; G01R 33/5614; G06K 9/52; G06T 2207/10016; G06T 2207/10076; G06T 2207/10088; G06T 7/0012; G06T 7/0016
See application file for complete search history.

(56) References Cited

U.S. PATENT DOCUMENTS 8,723,518 B2    5/2014  Seiberlich
10,492,710 B2 * 12/2019  Wang ..................... A61B 5/055
(Continued)

OTHER PUBLICATIONS

Buonincontri, Guido et al. "MR Fingerprinting with Simultaneous B1 Estimation" Magnetic Resonance in Medicine, vol. 76, pp. 1127-1135, 2016 // DIO: 10.1002/mrm.26009.
(Continued)

*Primary Examiner* — Rishi R Patel
(74) *Attorney, Agent, or Firm* — Quarles & Brady LLP

(57) ABSTRACT

A method for performing magnetic resonance fingerprinting includes acquiring a plurality of MR image datasets using at least two pulse sequence types, the plurality of MR image datasets representing signal evolutions for image elements in a region of interest, comparing the plurality of MR image datasets to a dictionary of signal evolutions to identify at least one parameter of the MR image datasets and generating a report indicating the at least one parameter of the MR image datasets.

20 Claims, 9 Drawing Sheets

(51) Int. Cl.
*G06T 7/00* (2017.01)
*G06V 10/42* (2022.01)

(56) References Cited

U.S. PATENT DOCUMENTS

| | | | | |
|---|---|---|---|---|
| 10,761,171 | B2* | 9/2020 | Gulani | G01R 33/50 |
| 2012/0235678 | A1* | 9/2012 | Seiberlich | G01R 33/543 |
| | | | | 324/307 |
| 2013/0265047 | A1* | 10/2013 | Griswold | G01R 33/56 |
| | | | | 324/309 |
| 2015/0301141 | A1 | 10/2015 | Griswold | |
| 2016/0116559 | A1* | 4/2016 | Cohen | G01R 33/5614 |
| | | | | 324/309 |
| 2016/0131729 | A1* | 5/2016 | Kang | G01R 33/50 |
| | | | | 324/309 |
| 2016/0349339 | A1* | 12/2016 | Brady-Kalnay | G01R 33/50 |
| 2018/0217220 | A1* | 8/2018 | Gulani | G01R 33/5613 |
| 2018/0306881 | A1* | 10/2018 | Tamada | G01R 33/54 |
| 2019/0310334 | A1* | 10/2019 | Nittka | G01R 33/5613 |

OTHER PUBLICATIONS

Cloos, Martijn A. et al. "Multiparametric imaging with heterogeneous radiofrequency fields" Nature Communications, vol. 7, No. 12445, Aug. 16, 2016 // DOI: 10.1038/ncomms12445.

Körzdörfer, Gregor et al. "Magnetic Field Fingerprinting (MFF)" Joint Annual Meeting ISMRM-ESMRMB, Jun. 16-21, 2018.

Körzdörfer, Gregor et al. "Robust B1+ sensitive FISP Magnetic Resonance Fingerprinting in Brain and Abdomen" ESMRMB Annual Scientific Meeting Abstract, Oct. 19-21, 2017.

Ma D. et al., Magnetic resonance fingerprinting, Nature 495, p. 187-193 (2013).

Wang, Charlie Yi et al. "In vivo Simultaneous Measurement of df, T1, T2, and T2* by Magnetic Resonance Fingerprinting with Quadratic RF Phase" ISMRM; abstract #3960; Workshop on MR Fingerprinting Cleveland 2017.

* cited by examiner

SYSTEM AND METHOD FOR MAGNETIC RESONANCE FINGERPRINTING USING A PLURALITY OF PULSE SEQUENCE TYPES

CROSS-REFERENCE TO RELATED APPLICATION

This application is based on, claims priority to, and incorporates herein by reference in its entirety U.S. Ser. No. 62/653,737 filed Apr. 6, 2018, and entitled "Method For Generating A Magnetic Resonance Data Set, Computer Program Product, Data Carrier and Magnetic Resonance System."

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting, "Nature, 2013; 495 (7440): 187-192.

Conventional magnetic resonance imaging ("MM") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weighting or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2 weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known signal evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

MRF typically performs a single pulse sequence type using the series of varied sequence blocks. One or more acquisition parameters are varied between at least two of the varied sequence blocks. A disadvantage to the sequence used in Ma et al. is a long spiral readout means that there is a lower limit to the repetition time $T_R$, resulting in artifacts.

It would be desirable to provide a system and method for magnetic resonance fingerprinting that reduces artifacts and has a high SNR efficiency.

SUMMARY OF THE DISCLOSURE

A method for performing magnetic resonance fingerprinting includes acquiring a plurality of MR image datasets using at least two pulse sequence types, the plurality of MR image datasets representing signal evolutions for image elements in a region of interest, comparing the plurality of MR image datasets to a dictionary of signal evolutions to identify at least one parameter of the MR image datasets and generating a report indicating the at least one parameter of the MR image datasets.

A magnetic resonance imaging (MRI) system includes a magnet system configured to generate a polarizing magnetic field about at least a portion of a subject, a magnetic gradient system including a plurality of magnetic gradient coils configured to apply at least one magnetic gradient field to the polarizing magnetic field and a radio frequency (RF) system configured to apply an RF field to the subject and to receive magnetic resonance signals from the subject using a coil array. The MRI system also includes a computer system programmed to acquire a plurality of MR image datasets using at least two pulse sequence types, the plurality of MR image datasets representing signal evolutions for image elements in a region of interest, compare the plurality of MR image datasets to a dictionary of signal evolutions to identify at least one parameter of the MR image datasets and generate a report indicating the at least one parameter of the MR image datasets.

BRIEF DESCRIPTION OF THE DRAWINGS

The present invention will hereafter be described with reference to the accompanying drawings, wherein like reference numerals denote like elements.

DETAILED DESCRIPTION

Figure 1:
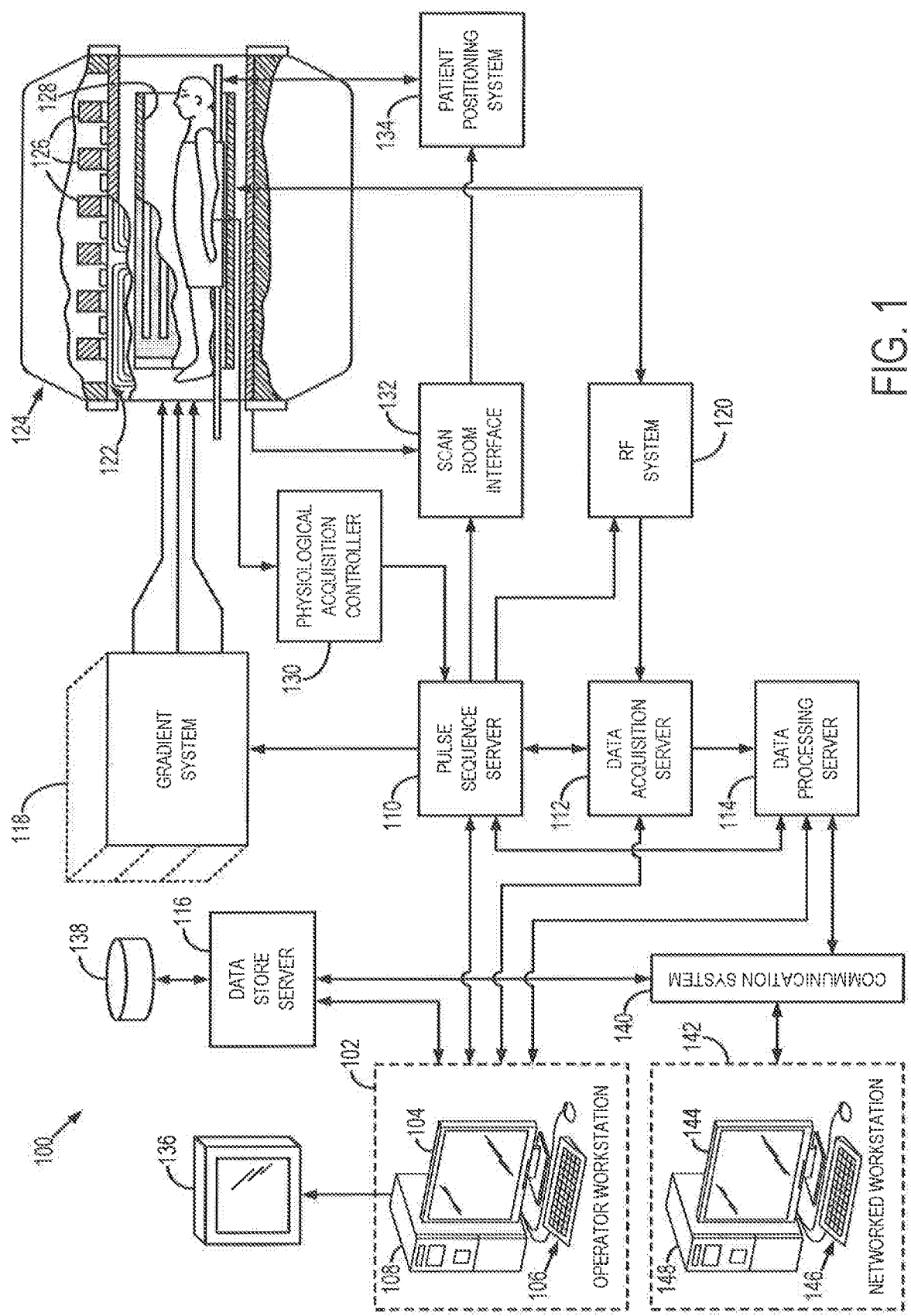
FIG. 1 is a schematic diagram of an example MRI system in accordance with an embodiment.

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques may be achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE"), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1,T_2,D)$ is a signal decay due to relaxation differences; and $M_0$ is the magnetization in the default or natural alignment to which spins align when placed in the main magnetic field.

While $E_i(T_1,T_2,D)$ is provided as an example, in different situations, the decay term, $E_i(T_1,T_2,D)$, may also include additional terms, $E_i(T_1,T_2,D, \ldots )$ or may include fewer terms, such as by not including the diffusion relaxation, as $E_i(T_1,T_2)$ or $E_i(T_1,T_2, \ldots )$. Also, the summation on "j" could be replace by a product on "j". The dictionary may store signals described by, $$S_i = R_i E_i (S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Thus, in MRF, a unique signal timecourse is generated for each pixel. This timecourse evolves based on both physiological tissue properties such as T1 or T2 as well as acquisition parameters like flip angle (FA) and repetition time (TR). This signal timecourse can, thus, be referred to as a signal evolution and each pixel can be matched to an entry in the dictionary, which is a collection of possible signal evolutions or timecourses calculated using a range of possible tissue property values and knowledge of the quantum physics that govern the signal evolution. Upon matching the measured signal evolution/timecourse to a specific dictionary entry, the tissue properties corresponding to that dictionary entry can be identified. A fundamental criterion in MRF is that spatial incoherence be maintained to help separate signals that are mixed due to undersampling. In other words, signals from various locations should differ from each other, in order to be able to separate them when aliased.

To achieve this process, a magnetic resonance imaging (MRI) system or nuclear magnetic resonance (NMR) system may be utilized. FIG. 1 shows an example of an MRI system 100 that may be used to perform magnetic resonance fingerprinting. In addition, MRI system 100 may be used to implement the methods described herein. MRI system 100 includes an operator workstation 102, which may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \quad (3);$$

and the phase of the received magnetic resonance signal may also be determined according to the following relationship:

$$\varphi=\tan^{-1}(Q/I) \quad (4).$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

As mentioned above, for -conventional MRF a pulse sequence may be performed using a series of varied sequence blocks to elicit MR signals (and signal evolutions) from each image element (e.g., a pixel or voxel) from a region of interest. The present disclosure provides a system and method for acquiring a plurality of image (or MR) datasets using a plurality of pulse sequences types. The image (or MR) datasets represent signal evolutions for each image element in the region of interest. In one embodiment, two pulse sequence types are used. In another embodiment, more than two pulse sequence types (e.g., N pulse sequence types, where N is an integer greater than 2) may be used. By using two or more pulse sequence types in the acquisition, a signal evolution may gain a characteristic profile by the change in the pulse sequence being used to acquire the plurality of image (or MR) datasets. Each pulse sequence type used may affect the signal evolution differently and, therefore, helps make it possible to differentiate between more parameters of the acquired signal evolutions. Accordingly, the generated signal evolutions exhibit variations depending on the pulse sequences used and the quantitative parameters to be determined for the acquired signal evolutions. In addition, parameters of the MR data may be obtained simultaneously and with fewer artifacts. In an embodiment, the methods described herein allow for $B_0$ and $B_1$ to be determined in one measurement.

Figure 2:
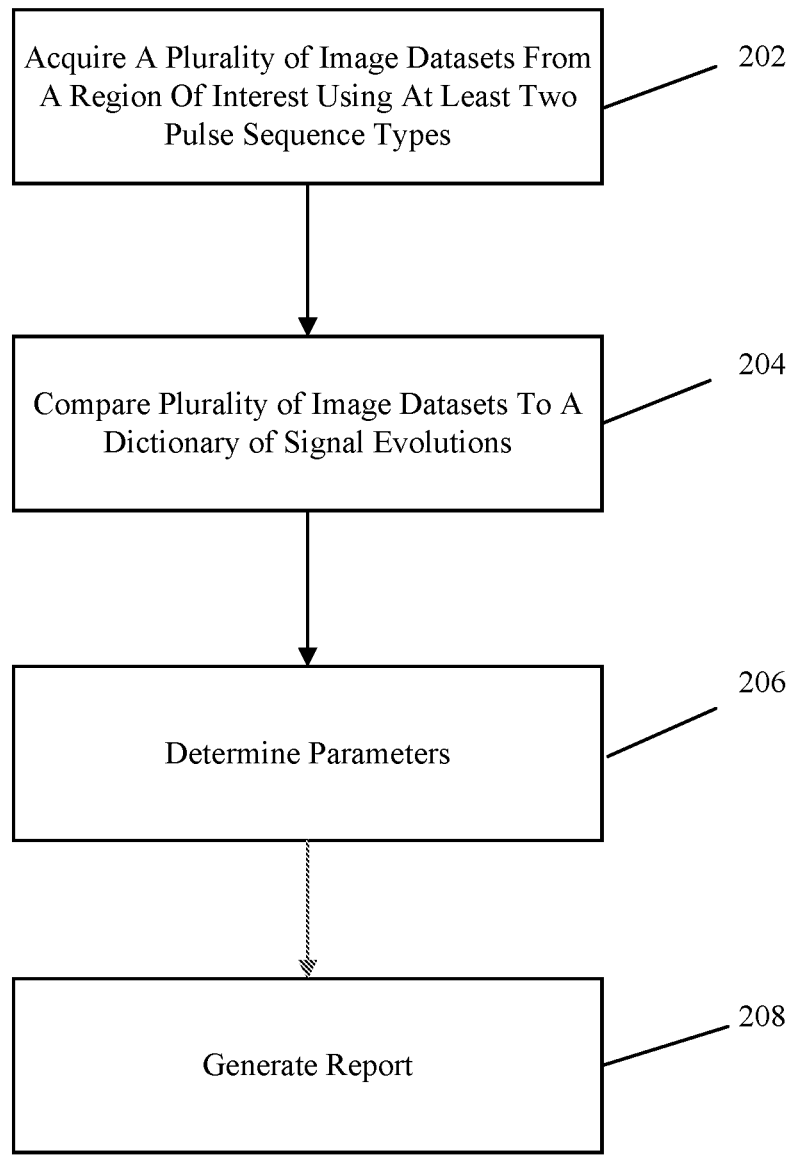
FIG. 2 illustrates a method for magnetic resonance fingerprinting in accordance with an embodiment.

FIG. 2 illustrates a method for magnetic resonance fingerprinting in accordance with an embodiment. At block 202, a plurality of image (or MR) datasets (e.g., a series of signal evolutions) is acquired from tissue(s) in a region of interest in a subject using at least two pulse sequence types. The image (or MR) datasets may be acquired using, for example, the MRI system 100 described above with respect to FIG. 1. The pulse sequence types may include, but are not limited to, Fast Imaging with Steady-State Free Precession (FISP), FLASH, TrueFISP, gradient echo, EPI, spin echo, TSE (Turbo Spin Echo), etc. In various embodiments, an entire image (or MR) dataset is acquired in a repetition time, $T_R$. Accordingly, in such embodiments, single-shot pulse sequences are used that can acquire a complete image dataset using a single radio frequency pulse.

Figure 3:
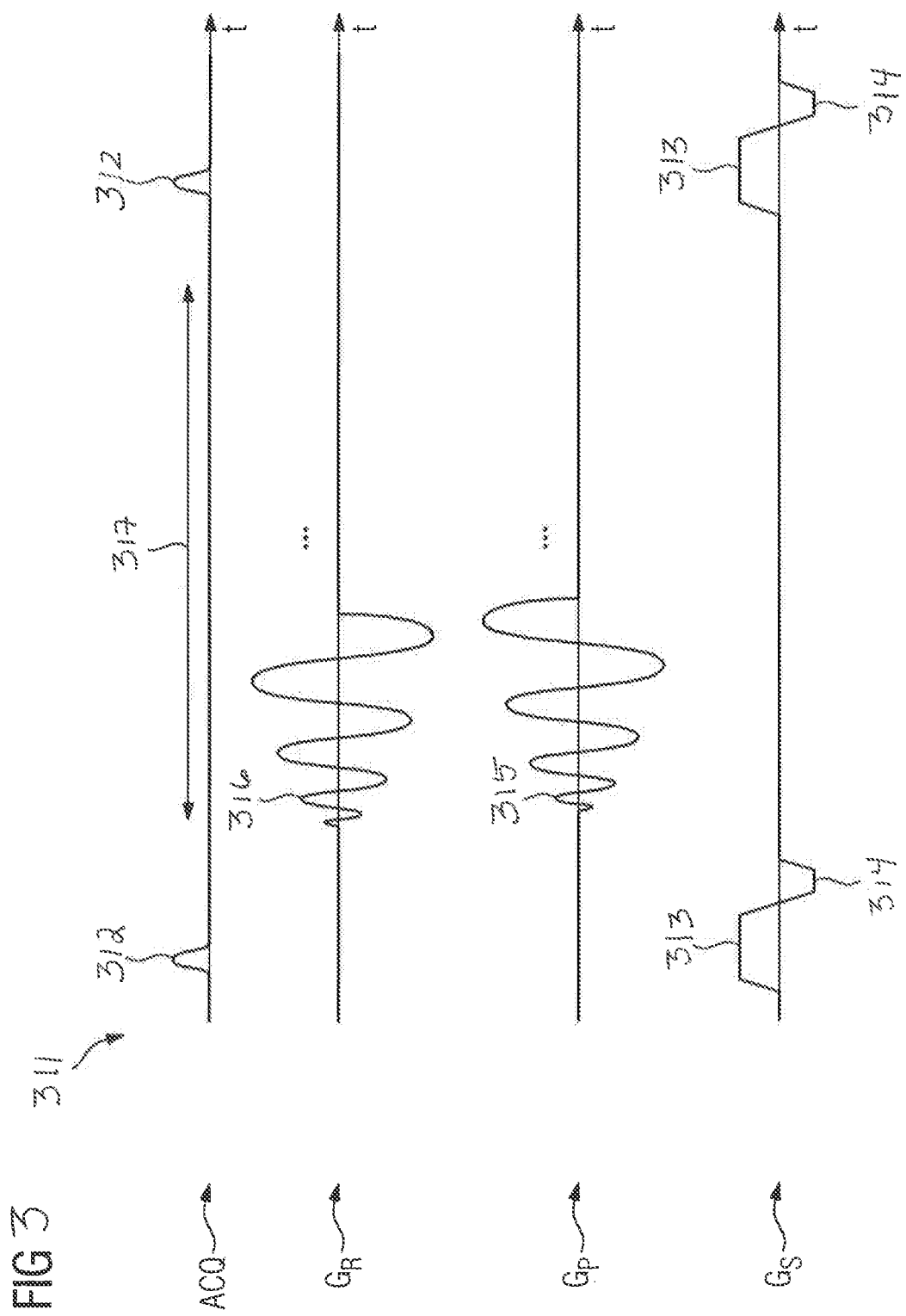
FIG. 3 shows an example FLASH pulse sequence in accordance with an embodiment.

FIG. 3 shows an example FLASH pulse sequence in accordance with an embodiment. In FIG. 3, the gradient axes of the FLASH pulse sequence diagram 311 are labeled, in accordance with convention, with $G_R$ for the readout direction, $G_P$ for the phase encoding direction and $G_S$ for the slice selection direction. ACQ denotes the axis for the radio-frequency pulses and the acquisition windows. A FLASH pulse sequence uses only longitudinal magnetization. The FLASH measurement sequence 311 is a type of single-shot sequence because a single radio-frequency pulse 312 is sufficient to obtain a complete image dataset. The FLASH pulse sequence 311 is a sequence based on a gradient echo and containing a radio-frequency pulse 312 that has a flip angle of less than 90°. A $T_2^*$-contrast may be adjusted by means of the echo time $T_E$, and a $T_1$-contrast may be adjusted by means of the repetition time $T_R$. The radio-frequency pulse 312 typically has a flip angle between 4° and 30° for weighted measurements.

In order to excite just one slice using the radio-frequency pulse 312, a slice selection gradient 313 is applied in the slice selection direction $G_S$ at the same time as the radio-frequency pulse 312. A slice rephasing gradient 314 follows immediately after the slice selection gradient 313 to correct the dephasing effect of the slice selection gradient on the magnetization in the transverse plane. A phase encoding gradient 315 is used in the phase encoding direction $G_P$. The phase encoding gradient 315 is applied in an oscillating manner, as is a readout gradient 316 in readout direction $G_R$. In a preferred embodiment, k-space is sampled in a spiral pattern. In other embodiments, Cartesian or radial sampling may be performed to sample k-space. MR signals 317 may be acquired accordingly. A second radio-frequency pulse 312 on the right in FIG. 3 shows that the excitation and acquisition of a second image dataset is started after the acquisition of the first image dataset without a pause. The second radio-frequency pulse 312 may have a different flip angle from the first radio-frequency pulse 312, as explained in more detail below. In addition, the phase may be changed in order to implement a phase cycle. Parallel imaging may be used to reduce SNR problems, because in this case less k-space data is acquired and this means that the repetition time $T_R$ can be reduced.

Figure 4:
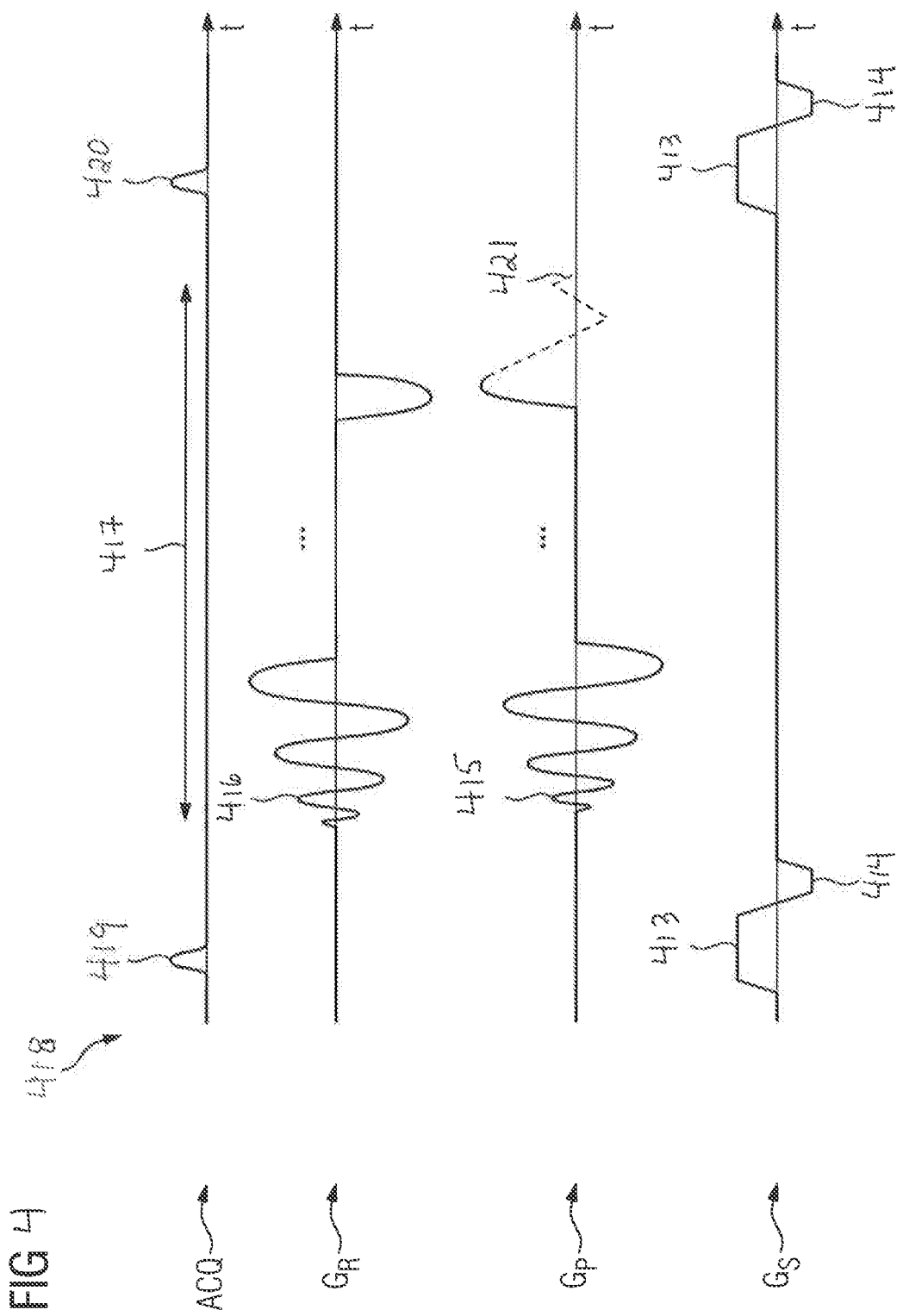
FIG. 4 shows an example FISP pulse sequence in accordance with an embodiment.

FIG. 4 shows an example FISP pulse sequence in accordance with an embodiment. In FIG. 4, the gradient axes of the FISP pulse sequence diagram 418 are labeled, in accordance with convention, with $G_R$ for the readout direction, $G_P$ for the phase encoding direction and $G_S$ for the slice selection direction. ACQ denotes the axis for the radio-frequency pulses and the acquisition windows. A FISP pulse sequence 418 uses longitudinal and transverse magnetization in the steady state. The FISP measurement sequence 418 is a type of single-shot sequence and only one radio-frequency pulse 419 is used to acquire a complete image dataset. In a FISP pulse sequence 418, at least one of the moments is not balanced out.

In order to excite just one slice using the radio-frequency pulse 419, a slice selection gradient 413 is applied in the slice selection direction $G_S$ at the same time as the radio-frequency pulse 419. A slice rephasing gradient 414 follows immediately after the slice selection gradient 413 to correct the dephasing effect of the slice selection gradient on the magnetization in the transverse plane. A phase encoding gradient 415 is used in the phase encoding direction $G_P$. The phase encoding gradient 415 is applied in an oscillating manner, as is the readout gradient 416 in readout direction $G_R$. In a preferred embodiment, k-space is sampled in a spiral pattern. In other embodiments, Cartesian or radial sampling may be performed to sample k-space. MR signals 417 may be acquired accordingly. The FISP pulse sequence 418 also includes a phase rewind gradient 421. This ensures that the sum of the gradient moments in the phase direction equals zero over one repetition time $T_R$. In the slice direction $G_S$, the sum of the gradient moments does not equal zero over one repetition time $T_R$. The gradients are balanced in the readout direction $G_R$, but this is not mandatory. Thus the sum of the gradients in the readout direction $G_R$ may also not equal 0 over one repetition time. In an embodiment, spiral trajectories are acquired and the resultant sum moment is always the same because the individual gradient moments always have the same variation over one repetition time. Acquisition of second image dataset is started by the radio-frequency pulse 420. This preferably has the same phase as the previous radio-frequency pulse 419 but a different flip angle.

Figure 5:
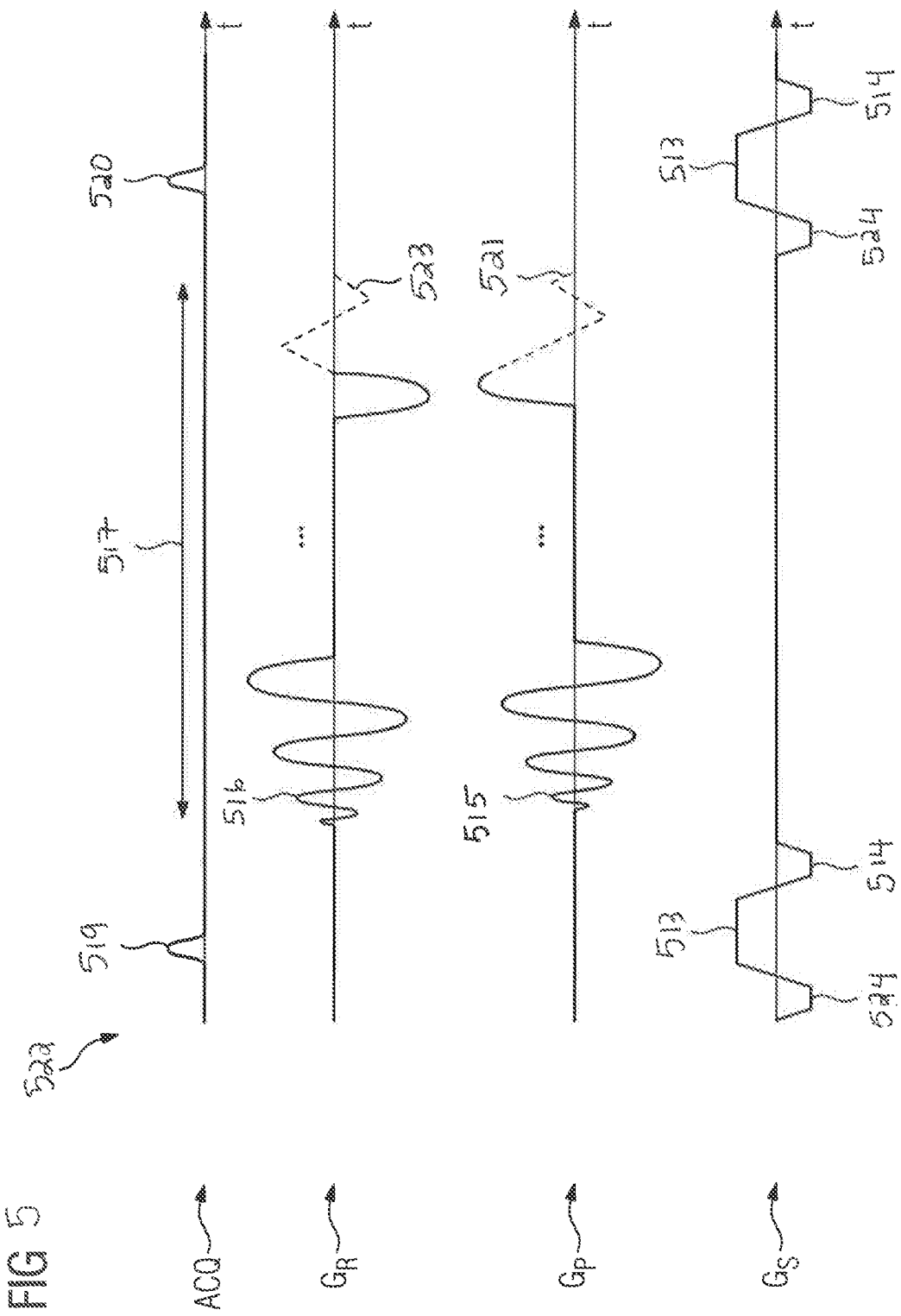
FIG. 5 shows an example TrueFISP pulse sequence in accordance with an embodiment.

FIG. 5 shows an example TrueFISP pulse sequence in accordance with an embodiment. In FIG. 5, the gradient axes of the TrueFISP pulse sequence diagram 522 are labeled, in accordance with convention, with $G_R$ for the readout direction, $G_P$ for the phase encoding direction and $G_S$ for the slice selection direction. ACQ denotes the axis for the radio-frequency pulses and the acquisition windows. A TrueFISP pulse sequence uses longitudinal and transverse magnetization in the steady state. The TrueFISP measurement sequence 522 is a type of single-shot sequence and a single radio-frequency pulse 519 is sufficient to obtain a complete image dataset. As used herein, True FISP is understood to mean a sequence design in which all moments sum to zero after a repetition time $T_R$.

In order to excite just one slice using the radio-frequency pulse 519, a slice selection gradient 513 is applied in the slice selection direction $G_S$ at the same time as the radio-frequency pulse 519. A slice rephasing gradient 514 follows immediately after the slice selection gradient 513 to correct the dephasing effect of the slice selection gradient on the magnetization in the transverse plane. A phase encoding gradient 515 is used in the phase encoding direction $G_P$. The phase encoding gradient 515 is applied in an oscillating manner, as is the readout gradient 516 in readout direction $G_R$. In a preferred embodiment, k-space is sampled in a spiral pattern. In other embodiments, Cartesian or radial sampling may be performed to sample k-space. MR signals 517 may be acquired accordingly. The FISP pulse sequence 418 also includes a phase rewind gradient 521. The True-FISP measurement sequence 522 also contains a readout rewind gradient 523 and a slice dephasing gradient 524. The TrueFISP-measurement sequence 522 is thereby "fully balanced" over one repetition time $T_R$, i.e. the sums of the gradient moments over one repetition time $T_R$ are equal to zero in all directions. Acquisition of a second image dataset is started by the radio-frequency pulse 520. The magnitudes of the flip angles of the radio-frequency pulses 519 and 520 may vary in the TrueFISP measurement sequence 522. The TrueFISP measurement sequence 522 may comprise phase cycles, as described further below. For example, a 90° phase cycle may be used. In this example, the first radio-frequency pulse 519 has a phase φ, the second radio-frequency pulse 520 has a phase φ+180°, a third radio-frequency pulse (not shown) has a phase (φ+90°), a fourth radio-frequency pulse (not shown) has a phase (φ+270°), a fifth radio-frequency pulse not shown) has a phase (φ+180°), a sixth radio-frequency pulse (not shown) has a phase (q)+360°), etc. In another example, a 180° phase cycle may be used. In this example, the 180° phase cycle jumps in steps of 180° instead of in steps of 90°. In another example, a 270° phase cycle may be used. In this example, the 270° phase cycle jumps in steps of 270°.

Figure 6:
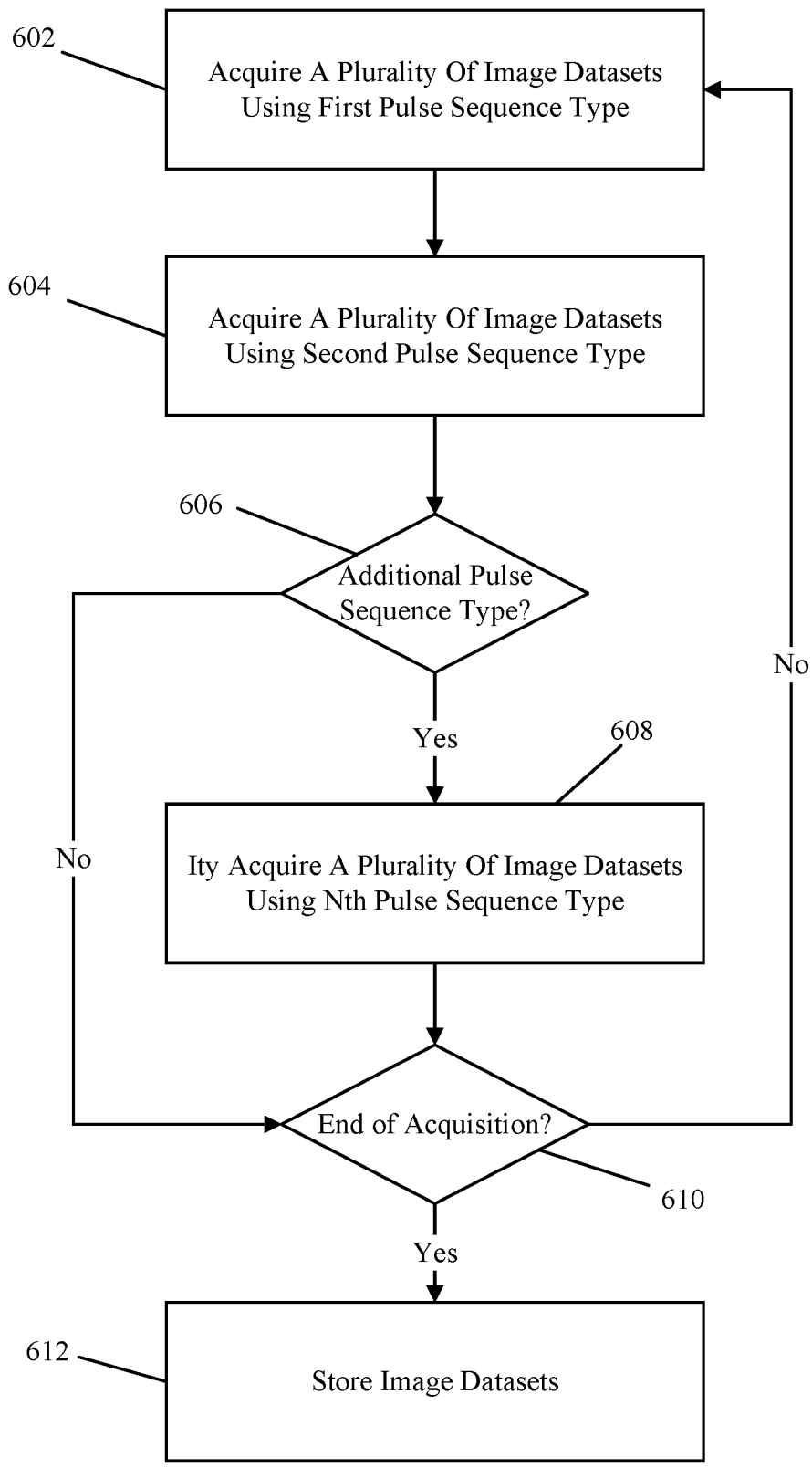
FIG. 6 illustrates a method for acquiring a plurality of image datasets using two or more pulse sequence types in accordance with an embodiment.

Returning to FIG. 2, as mentioned at block 202, a plurality of image (or MR) datasets are acquired using at least two pulse sequence types. In an embodiment, each pulse sequence is applied in a different stage of the acquisition. FIG. 6 illustrates a method for acquiring a plurality of image (or MR) datasets using two or more pulse sequence types in accordance with an embodiment. At block 602, a first pulse sequence type is used to acquire plurality of image datasets in a first stage. At block 604, a second pulse sequence type is used to acquire a plurality of image datasets in a second stage. In one embodiment, at least one stage uses a TrueFISP pulse sequence to acquire data and at least one stage uses a FLASH sequence to acquire data. In another embodiment, at least one state uses a FISP sequence to acquire data. A FISP sequence affects the signal evolution again differently from FLASH or TrueFISP, and thus helps to make it possible to differentiate between more parameters.

In an embodiment, at least one acquisition parameter of the pulse sequence type used in the first stage is varied during acquisition of the plurality of image datasets in the first stage. In addition, at least one acquisition parameter of the pulse sequence type used in the second stage is varied during acquisition of the plurality of image datasets in the second stage. In another embodiment, at least some of the image datasets acquired by a particular pulse sequence in a stage have certain identical acquisition parameters, e.g., the same FOV, same orientation, same number of k-space measurement points, etc. Although resolution can be adapted mathematically, this always results in inaccuracies. In an embodiment, for encoding the quantitative parameters to be determined, the sole acquisition parameter varied (and that affects the MR signal) in at least one of the pulse sequences is the flip angle. Accordingly, in this embodiment, neither the repetition time $T_R$ nor the echo time $T_E$ are varied. In other words, for encoding the parameters to be determined, the flip angle α is the sole quantitative parameter varied from the group repetition time $T_R$, echo time $T_E$ and flip angle α in this embodiment. This applies in particular to the FLASH and/or TrueFISP pulse sequence. In an embodiment, the flip angle can be the sole acquisition parameter varied in all the pulse sequences except the FISP pulse sequence. In another embodiment, the flip angle and the echo time $T_E$ are varied in at least one of the at least two pulse sequences. In one embodiment, the flip angle and the echo time $T_E$ are the only acquisition parameters varied for the FISP pulse sequence. In other words, for the FISP pulse sequence, for encoding the parameters to be determined, the flip angle α and the echo time $T_E$ may be the sole quantitative parameters varied from the group repetition time $T_R$, echo time $T_E$ and flip angle α.

In an embodiment, the flip angle in a pulse sequence performed during a stage can follow a predetermined distribution over a plurality of image datasets. In this embodiment, the flip angle is thus not varied in a pseudorandom manner but is varied using a strategy. In one embodiment, the flip angle can follow a normal distribution. It therefore starts with no flip angles. The flip angle increases up to a maximum value and then decreases again. In another embodiment, the distribution is embodied as a half-sine curve, in particular the positive half. It rises more steeply than a normal distribution and has a wider plateau in the maximum region. In another embodiment, the distribution is embodied as a half-sine$^2$ curve, in particular the positive half. This rises even more steeply than a sine curve. There may be at least one flip angle distribution in a stage. In particular, in an embodiment there is one flip angle distribution in at least one stage. In another embodiment, there may be two flip angle distributions in one stage. A normal distribution can advantageously be followed in a stage in which image datasets are acquired using a FLASH pulse sequence. In an embodiment, the flip angles can follow a sine distribution in a stage in which image datasets are acquired using a FISP or TrueFISP pulse sequence.

In another embodiment, the phase of the radio-frequency pulses may be varied in at least one of the pulse sequences. The phase of the radio-frequency pulses is an acquisition parameter and varies when using a phase cycle. The phase of the radio frequency pulses is a parameter that may be changed in order to compensate for device shortcomings or that belongs intrinsically to a pulse sequence. Such acquisition parameters are varied even when parameters of the MR data are not quantified. However, the phase cycles (discussed further below) may be another parameter that can be varied in addition to other acquisition parameters.

In one embodiment, in at least one stage, the TrueFISP sequence can comprise at least one phase cycle. A phase cycle is understood to mean the defined progression of the phase for specific radio-frequency pulses or all radio-frequency pulses. This is a variable that does not depend on the flip angle. In an example, the phase cycle is a 180° phase cycle. Then the phases of the radio-frequency pulses in the TrueFISP sequence alternate from x to −x or from y to −y and back. In another example, the phase cycle can be designed to be a 90° phase cycle. Then the phases can change, for example, from x to y to −x to −y and then from the beginning again. In another example, the phase cycle can be designed to be a 270° phase cycle. In this example, one phase cycle is preferably used per distribution. Thus for three distributions of the flip angle, three different phase cycles can also be used. For more distributions, it is also possible to use more phase cycles. In one embodiment, two phase cycles can be used in one stage with the TrueFISP sequence. A 180° phase cycle can be used as one phase cycle and a 90° phase cycle as another phase cycle. In an embodiment, the 180° phase cycle can be used as the first phase cycle. It is possible to vary cycle-induced artifacts such as the position of the "dark band", or avoid said artifacts, by changing the phase cycle.

In one embodiment, a predetermined phase is used with the FISP sequence. The same phase is preferably used whenever a FISP sequence is started. In another embodiment, RF spoiling may be employed when using the FLASH sequence. RF spoiling means using a phase cycle that prevents potential T2-weighting of the magnetization. The add-on phase can preferably equal 117° or a multiple thereof. In this case, the phase to be used is obtained from the previous phase by adding a multiple of 117°. The very first phase can be chosen to have any value and does not have to be a multiple of 117°. 117°, as a multiple of one, also counts as a multiple.

In one embodiment, the repetition time $T_R$ is kept constant in the methods described herein. For Cartesian sampling, there are several embodiments that result for a constant $T_R$. In a first embodiment, $T_R$ is kept constant in an image dataset, but can change for repeat runs of the same pulse sequence and especially when the pulse sequence is changed. In another embodiment, the repetition time $T_R$ is constant for repeat runs of the same pulse sequence. For example, all the FLASH sequences in one stage are acquired with the same repetition time $T_R$. The repetition time $T_R$ can change, however, when there is a switch to another pulse sequence type, for example, the TrueFISP sequence or vice versa. $T_R$ may also be different in a later stage when the FLASH sequence is used again. In a third embodiment, the repetition time $T_R$ is constant during the entire measurement signal acquisition (i.e., for each stage and each pulse sequence type). In an embodiment using spiral sampling, in which a complete image dataset is acquired after one radio-frequency pulse, the repetition time $T_R$ may be kept constant either in each stage or over all the stages. As mentioned above, the signal evolution gains a characteristic profile by a change in the measurement sequence rather than by constant changes to a plurality of measurement parameters.

The first pulse sequence type and the second pulse sequence type may use one of, for example, spiral sampling, Cartesian sampling or radial sampling of k-space. In one embodiment, spiral sampling of k-space may be used be used for at least one of the pulse sequence types used. In another embodiment, spiral k-space sampling may be used for all the pulse sequence types used and for all the acquired image datasets. With spiral sampling, a complete image (or MR) dataset can be acquired after each radio-frequency pulse. In an embodiment using spiral sampling for each pulse sequence type, the difference in the sequences then lies in the gradients applied in a repetition time $T_R$. In this embodiment, the definition of the repetition time $T_R$ is the usual definition, namely the time between two corresponding successive points in a series of radio-frequency pulses and signals. In this embodiment, phase cycles then lie over a plurality of image datasets and not, as is the case for segmented k-space sampling, over a plurality of k-space rows. In another embodiment, parallel imaging may be used to acquire the image datasets using each pulsed sequence type. Even greater subsampling can then be used in the k-space acquisition.

In an embodiment, the spiral trajectories of at least two successive image datasets may be rotated or turned or otherwise varied in the acquisition slice without altering the resolution of the k-space points and/or the number of k-space points. Possible subsampling artifacts then become incoherent and do not affect the matching (described further below). In an embodiment, the image datasets are acquired without steady state preferably for at least one pulse sequence type. For example, more than half of the image datasets may be acquired without steady state. In another example, more than 75% of the image datasets may be acquired without steady state. In another example, all the image datasets may be acquired without steady state. In an embodiment where at least one pulse sequence type is FLASH and at least one pulse sequence type is TrueFISP, with segmented k-space sampling at least the majority of the image datasets are acquired in the steady state. In an embodiment, steady state may be implemented, for example, for a FLASH sequence, by acquiring a first image dataset with the FLASH sequence using a flip angle of 4°, and by acquiring the next image dataset with the FLASH sequence using a flip angle of 6°. Single-shot sampling is possible for the spiral sampling. In an embodiment, change in the flip angle for successive radio-frequency pulses, and therefore also in repetition times $T_R$, is sufficient to avoid a steady state.

In an embodiment, a plurality of image datasets of each stage are acquired in immediate succession using each sequence. For example, a plurality of TrueFISP image datasets can be acquired in immediate succession and afterwards a plurality of FLASH image datasets in immediate succession. Some of the image datasets are preferably measured immediately one after the other. In other words, the final magnetization can be adopted by the sequence that follows. In the methods of the present disclosure, signal evolutions are generated that exhibit variations depending on the pulse sequences and the quantitative parameters to be determined. These variations are smaller when there are measurement pauses, because the acquired MR signal then depends more heavily on the initial magnetization $M_0$ than on the stages previously performed. In one embodiment, all the image datasets in a stage are measured immediately one after the other. In principle, any length of pause can exist between two stages. In an embodiment, all the pulse sequences or image datasets, i.e. even when there is a change in pulse sequence or change in stage, are measured immediately one after the other. For example, a FLASH having a large flip angle can be used to acquire an image dataset for a relatively short $T_R$. Although this already provides information about $T_1$, this information is improved if the subsequent measurement, a FLASH with a smaller flip angle, starts with the magnetization at the end of the preceding FLASH compared with when the magnetization relaxes back to $M_0$ as a result of a pause. In addition, a measurement containing pauses no longer constitutes a signal evolution but just individual measurement points.

In one embodiment, at least 10 image datasets can be acquired using each sequence. In an embodiment, at least 10 image datasets are acquired per stage. In an embodiment, discussed further below, where a series of three pulse sequence types are repeated a total of three times, at least 90 image datasets are obtained. This is a substantially larger number of sample points in the signal evolution than in conventional parameter maps, in which there are often only six to ten sample points for reasons of time.

Referring to FIG. 6, at block 606 if the acquisition includes another pulse sequence type a plurality of image (or MR) datasets are acquired using the next pulse sequence type at block 608. An acquisition may use N pulse sequence types, where N is an integer value. In one embodiment, three pulse sequence types are used. For example, a FISP sequence, a TrueFISP sequence and then a FLASH sequence may be used in three successive stages. Accordingly, first a plurality of FISP image datasets are acquired, where in principle any number of image datasets can be acquired in one stage provided it is done using the same pulse sequence. This does not mean, however, that all the acquisition parameters of the sequence would have to stay the same in one stage. A variation in one or more acquisition parameters, for instance to prevent a steady state, may be used. In one embodiment, the flip angle is varied. Then follows a stage in which one or more image datasets are acquired using a TrueFISP sequence and then a stage in which one or more image datasets are acquired using a FLASH sequence.

Once all pulse sequence types (N) have been applied or if the acquisition does not include another pulse sequence type at block 606, it is determined if the acquisition is complete at block 610. If the acquisition is not compete, a series of two or more pulse sequences may be repeated. Accordingly, if the acquisition is not complete, the process returns to block 602 and the N pulse sequence types are again used in series to acquire a plurality of image datasets. A series of pulse sequences (e.g. a series of a FISP sequence, TrueFISP sequence and FLASH sequence) is referred to herein as a block. The described series, i.e. the block, can advantageously be repeated at least once. The block is thus performed at least twice. In one embodiment, the series is performed three times. If the acquisition is complete at block 610, the acquired MRF data may be stored at block 612 in memory or data storage of, for example, an MRI system (e.g., the MRI system 100 of FIG. 1) or other computer system.

Figure 7:
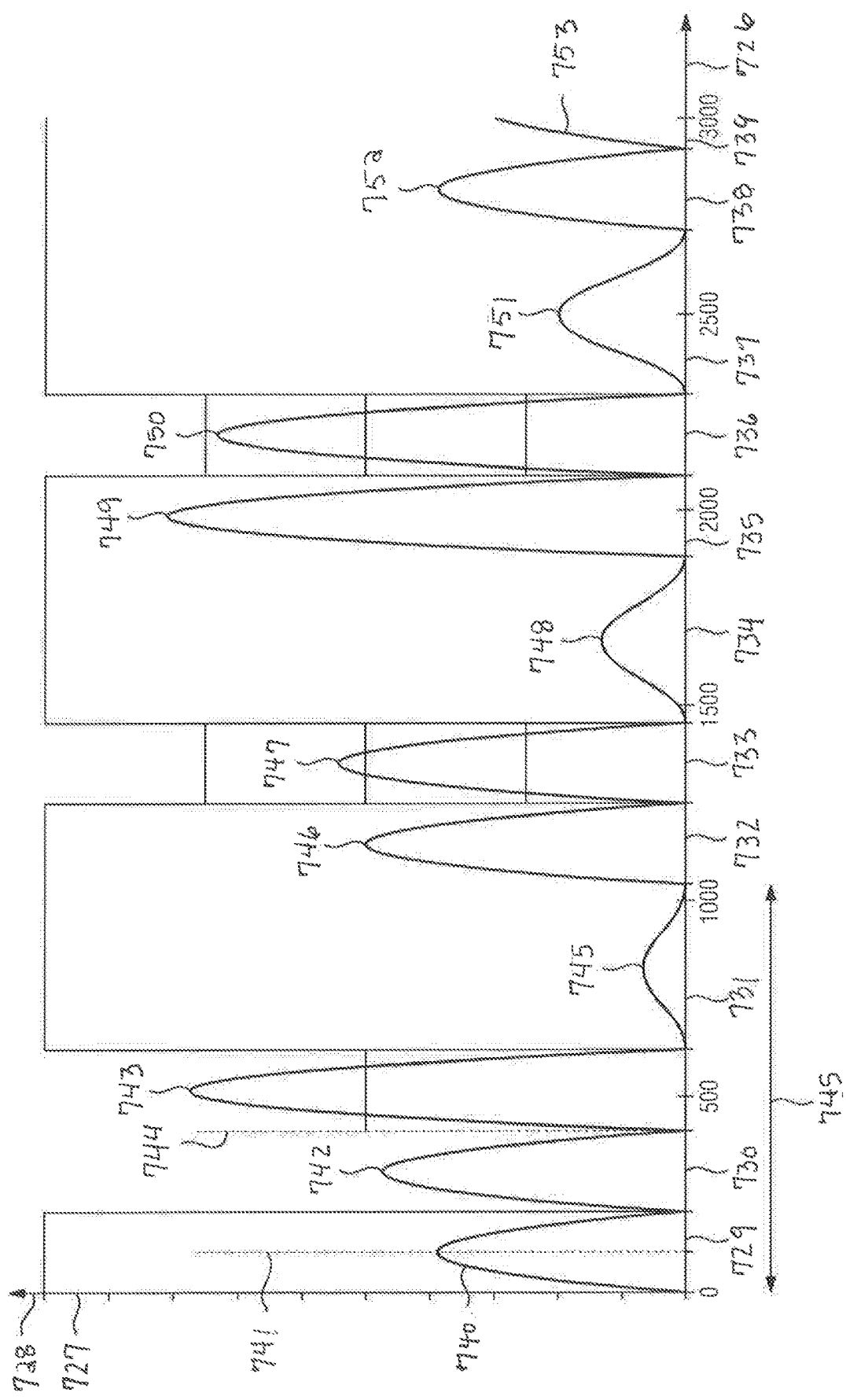
FIG. 7 shows an example acquisition method using a plurality of pulse sequence types in accordance with an embodiment.

FIG. 7 shows an example acquisition method using a plurality of pulse sequence types in accordance with an embodiment. FIG. 7 shows the example acquisition method for acquiring a plurality of image (or M) datasets schematically. In FIG. 7, the number of the acquired image dataset is plotted on the axis 726, and different variables are plotted on the axis 727. The flip angle in ° is plotted as the first variable from 0° at the origin to 90° at the axis point 728. The axis 276 extends from the image dataset 1 to the image dataset 3100. The 3000 image datasets are distributed over eleven stages 729, 730, 731, 732, 733, 734, 735, 736, 737, 738 and 739.

In the first stage 729, a curve 740 plots for two hundred image datasets the flip angle used during an acquisition in the FISP measurement sequence 418. As was explained with regard to FIG. 4, a complete image dataset is acquired after a radio-frequency pulse having a specific flip angle is applied, and then the next radio-frequency pulse having the next flip angle is applied and another image dataset acquired. FIG. 7 accordingly shows in stage 729 a flip-angle distribution, which corresponds to a half-sine$^2$ curve. The maximum flip angle is 24° in magnitude and constant phases are used. A line 741 is indicated for the hundredth image dataset purely by way of example. The corresponding flip angle is the maximum flip angle of the curve 740.

In the second stage 730, four hundred image datasets are acquired using the TrueFISP sequence 522 according to FIG. 5. Flip angles given by the curves 742 and 743 are used in this case. These flip angles reach 45° for the curve 742, and 72° for the curve 743. Again for the stage 30, a line 744 is shown purely by way of example at the flip angle for the four-hundredth image dataset. The flip angle equals 1° here. A particular feature in stage 730 is the use of two different phase cycles. A 00 phase cycle, i.e. no phase cycle, is used when running through the flip angles of the curve 742, and a 180° phase cycle is used when running through the curve 743. A 00 phase cycle denotes a fixed phase.

In the subsequent stage 731, the flip angles for acquiring four-hundred-and-fifty image datasets using a FLASH sequence 311 (shown in FIG. 3) are shown in the curve 745. These are smaller than in the FISP or TrueFISP sequence and reach 6°. They too have a sine$^2$ distribution. In addition to varying the flip angles, a phase cycle for achieving RF spoiling is applied during the repeated run-through of the FLASH sequence. In this case, the phase is increased by multiples of 117°, as already described. The series of the measurement sequences 311, 418 and 522 together form a block 745. The block 745 is used a total of three times in FIG. 7. The block 745 is defined solely on the type of the measurement sequence but not on the number of image datasets or on the flip-angle curves.

In the stage 732, again about 200 image datasets are acquired using a FISP sequence 418 (shown in FIG. 4). As in stage 729, the phase is constant but the maximum flip angle equals 45°. These lie on the curve 746. 200 image datasets acquired using a TrueFISP sequence 522 (shown in FIG. 5) follow in stage 733. In this case, a 90° phase cycle is used, and the maximum flip angle equals 50°. The flip angles are plotted on the curve 747. The next approximately 450 image datasets in stage 734 are for acquisition using a FLASH sequence, as in stage 731. The curve 748 shows a sine$^2$ distribution with a maximum value of 14°. Curve 749 in stage 735 reaches 72° and shows the flip angles of the radio-frequency pulse 419 for the third-time use of a FISP sequence 418. The phase is again constant in this run-through. A 270° phase cycle is employed during acquisition of a further two hundred image datasets using a TrueFISP sequence 522 according to FIG. 5. The flip angles plotted in the curve 750 in stage 36 reach 65°.

The next approximately 450 image datasets in stage 737 are acquired using the FLASH sequence 311 according to FIG. 3. The curve 751 represents a flip-angle variation up to a maximum of 20°, again with a sine$^2$ distribution. In the last stage 378 are two curves 752 and 753 for acquiring image datasets using a FISP sequence. These again represent flip-angle variations. A constant phase is used for the FISP measurement sequence 418, as was the case in the previous stages.

In an embodiment, irrespective of the specific number of images and the respective maximum flip angles, a flip-angle variation having a $\sin^2$ distribution may be used in all the stages. As described above, far fewer image datasets can also be acquired in one stage, however, in an embodiment, at least 10 image datasets are acquired in one stage.

Figure 8:
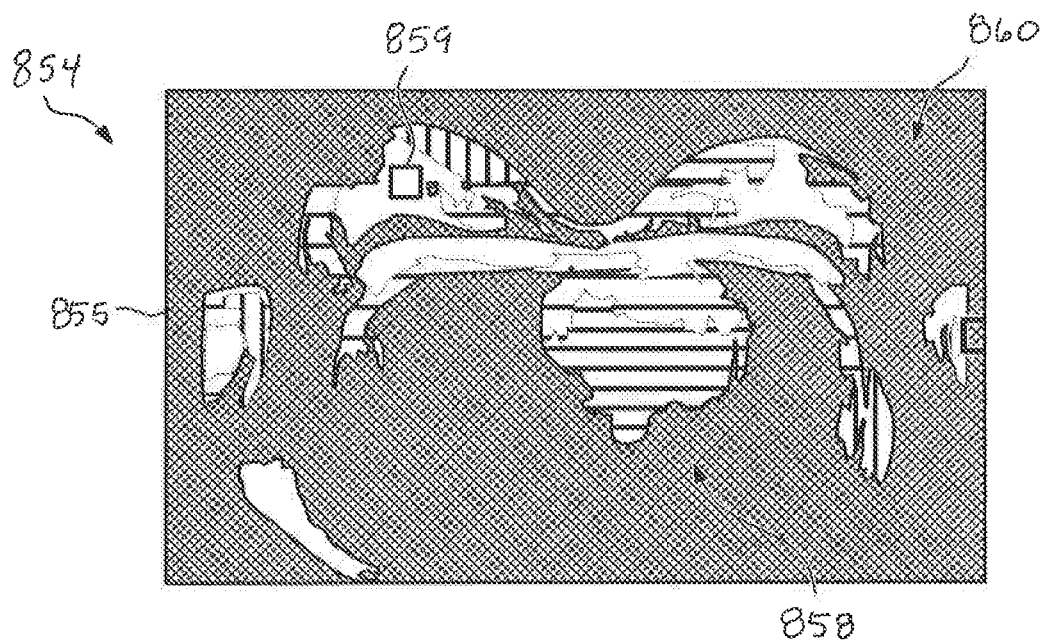
FIG. 8 shows an example magnetic resonance dataset acquired using a FISP pulse sequence in accordance with an embodiment.
Figure 9:
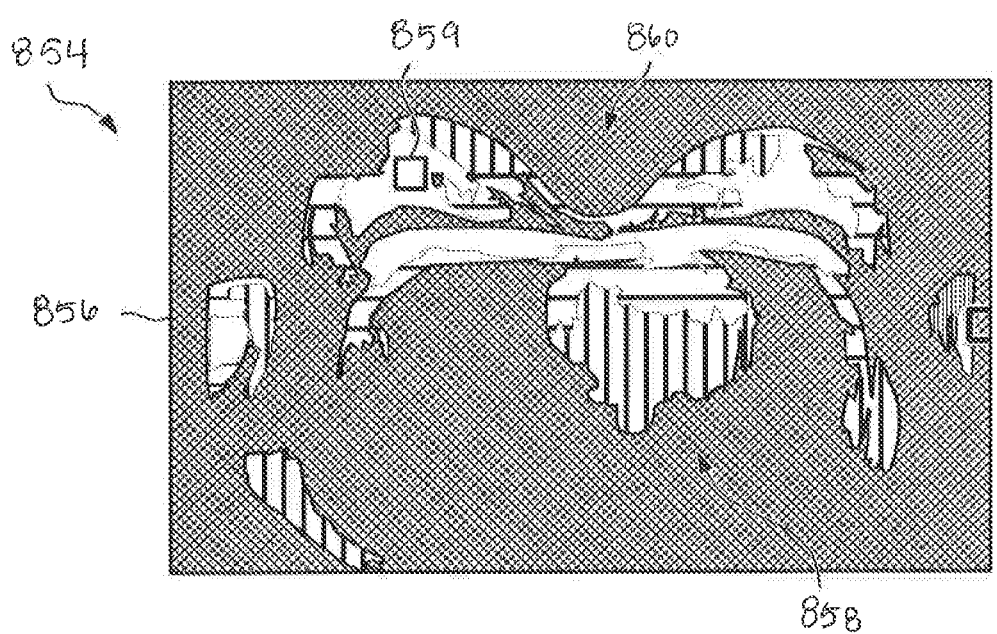
FIG. 9 shows an example magnetic resonance dataset acquired using a TrueFISP pulse sequence in accordance with an embodiment.
Figure 10:
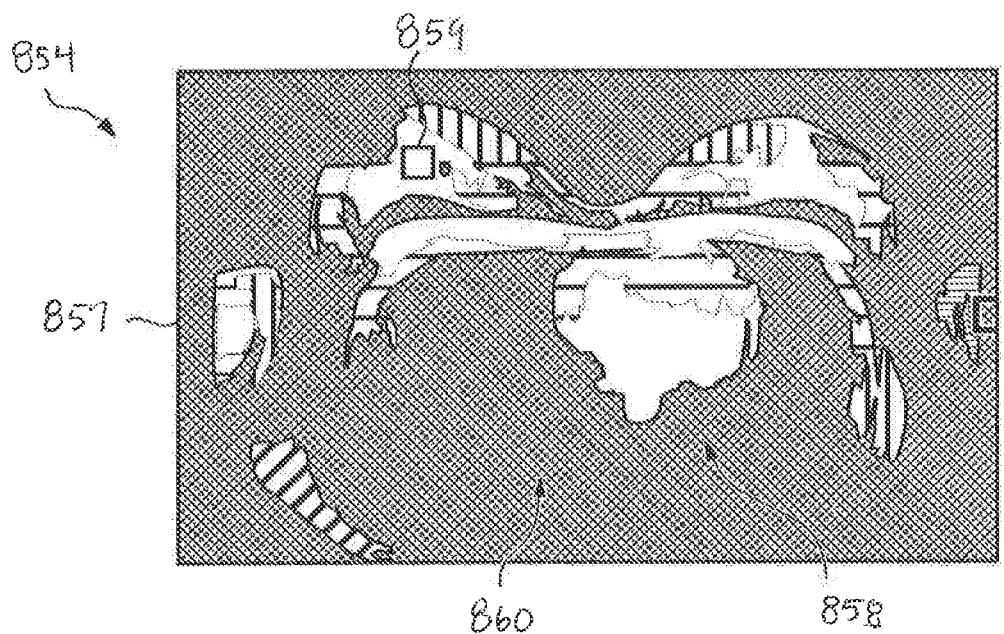
FIG. 10 shows an example magnetic resonance dataset acquired using a FLASH pulse sequence in accordance with an embodiment.

FIG. 8 shows an example image (or MR) dataset 855 acquired using a FISP pulse sequence in accordance with an embodiment. FIG. 9 shows an example image (or MR) dataset 856 acquired using a TrueFISP pulse sequence in accordance with an embodiment. FIG. 10 shows an example image (or MR) dataset 857 acquired using a FLASH pulse sequence in accordance with an embodiment. Image datasets 855, 856 and 857 are examples of the 3000 image datasets obtained in the procedure according to FIG. 7. The necessary postprocessing is sufficiently known. The image datasets 855, 856 and 857 each depict a region under examination 858. The image dataset 855 was acquired using the FISP measurement sequence 418 (shown in FIG. 4), image dataset 856 using the TrueFISP measurement sequence 522 (shown in FIG. 5), and image dataset 857 using the FLASH sequence 311 (shown in FIG. 3). In each case, the flip angle is one of the possible flip angles from the curves 740 to 753 shown in FIG. 7. However, the signal also depends on the history experienced in each case. The raw data acquired may be converted into an image dataset by a non-uniform Fourier transform. This may be subject to artifacts, but this is adequate for matching.

The analysis to determine quantitative parameters (described further below) is performed for each image element. The image element 859 is indicated purely by way of example. In all the image datasets 855, 856 and 857, the image element at the same position, namely the image element 859, is used to obtain a signal evolution. A signal evolution is determined and analyzed for each of the other image elements in the image dataset. The regions 860 in which only noise signal is present can be identified using a threshold value, for instance, and omitted in order to minimize the analysis time.

Returning to FIG. 2, the plurality of image (or MR) datasets acquired at block 202 are stored and compared to a dictionary of signal evolutions (e.g., simulated signal evolutions) at block 204 to match the acquired signal evolutions with signal evolutions stored in the dictionary. Comparing the image datasets (e.g., the signal evolutions) to the dictionary may be performed in a number of ways such as, for example, using a pattern matching, template matching or other matching algorithm. In one embodiment, the inner products between the normalized measured time course of each pixel and all entries of the normalized dictionary are calculated, and the dictionary entry corresponding to the maximum value of the inner product is taken to represent the closest signal evolution to the acquired signal evolution. At block 206, one or more parameters of the MR data are determined based on the comparison and matching at block 204. The parameters to be determined may include, for example, longitudinal relaxation time (T1), transverse relaxation time (T2), main or static magnetic field ($B_0$), transmit field $B_1$, proton density (PD) and ADC. In one embodiment, a $B_0$ value, a $B_1$ value, a $T_1$ value and a $T_2$ value may be determined from at least one signal evolution. In an embodiment, it is therefore possible to determine $B_0$ and $B_1$ in one measurement. In an embodiment, at least one parameter of the subject under examination can be determined from at least one signal evolution. At block 208, a report may be generated indicating at least one of the identified parameters for the tissue in a region of interest in a subject. For example, the report may include a quantitative indication of the at least one parameter. The report may include, for example, images or maps, text or metric based reports, audio reports and the like. The report may be provided to a display (e.g., display 104, 136 or 144 shown in FIG. 1).

Computer-executable instructions for magnetic resonance fingerprinting and acquiring a plurality of image datasets using two or more pulse sequence types according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly states, are possible and within the scope of the invention.

The invention claimed is:

1. A method for performing magnetic resonance fingerprinting comprising:
    acquiring a first plurality of MR image datasets using a first pulse sequence type during a first stage, the first pulse sequence type using a constant repetition time;
    acquiring a second plurality of MR image datasets using a second pulse sequence type during a second stage, wherein the second pulse sequence type is a different type of pulse sequence type than the first pulse sequence type and uses the constant repetition time of the first pulse sequence type, wherein the first plurality of MR image datasets and the second plurality of MR image datasets represent acquired signal evolutions for image elements in a region of interest and wherein each acquired signal evolution for each image element has a characteristic profile generated by a change from the first pulse sequence type in the first stage to the second pulse sequence type in the second stage;
    comparing the characteristic profiles of the acquired signal evolutions to a dictionary of reference signal evolutions to identify at least one parameter of the MR image datasets; and
    generating a report indicating the at least one parameter of the MR image datasets.

2. The method according to claim 1, wherein the first pulse sequence type is a FLASH pulse sequence and the second pulse sequence type is a FISP pulse sequence.

3. The method according to claim 1, wherein the first pulse sequence type is a FLASH pulse sequence and the second pulse sequence type is a TrueFISP pulse sequence.

4. The method according to claim 1, wherein the first pulse sequence type is a FISP pulse sequence and the second pulse sequence type is a FLASH pulse sequence.

5. The method according to claim 1, wherein the first pulse sequence type is a TrueFISP pulse sequence and the second pulse sequence type is a FLASH pulse sequence.

6. The method according to claim 1, further comprising acquiring a third plurality of MR image datasets using a third pulse sequence type during a third stage, wherein the third pulse sequence type is a different type of pulse sequence type than the first pulse sequence type and the second pulse sequence type and uses the constant repetition time of the first pulse sequence type and the second pulse sequence type.

7. The method according to claim 6, wherein the first pulse sequence type is a FISP pulse sequence, the second pulse sequence type is a TrueFISP pulse sequence and the third pulse sequence type is a FLASH pulse sequence.

8. The method according to claim 7, wherein the first stage, second stage and third stage are successive stages.

9. The method according to claim 1, wherein in at least one of the first pulse sequence type and the second pulse sequence type a phase cycle is varied during acquisition of the first plurality of MR datasets or the second plurality of MR image datasets.

10. The method according to claim 7, wherein a series of the FISP pulse sequence, the TrueFISP pulse sequence and the FLASH pulse sequence is repeated at least once.

11. A magnetic resonance imaging (MRI) system comprising:
a magnet system configured to generate a polarizing magnetic field about at least a portion of a subject;
a magnetic gradient system including a plurality of magnetic gradient coils configured to apply at least one magnetic gradient field to the polarizing magnetic field;
a radio frequency (RF) system configured to apply an RF field to the subject and to receive magnetic resonance signals from the subject using a coil array; and
a computer system programmed to:
acquire a first plurality of MR image datasets using a first pulse sequence type during a first stage, the first pulse sequence type using a constant repetition time;
acquire a second plurality of MR image datasets using a second pulse sequence type during a second stage, wherein the second pulse sequence type is a different pulse sequence type than the first pulse sequence type and uses the constant repetition time of the first pulse sequence type, wherein the first plurality of MR image datasets and the second plurality of MR image datasets represent acquired signal evolutions for image elements in a region of interest and wherein each acquired signal evolution for each image element has a characteristic profile generated by a change from the first pulse sequence type in the first stage to the second pulse sequence type in the second stage;
compare the characteristic profiles of the acquired signal evolutions to a dictionary of reference signal evolutions to identify at least one parameter of the MR image datasets; and
generate a report indicating the at least one parameter of the MR image datasets.

12. The system according to claim 11, wherein the first pulse sequence type is a FLASH pulse sequence and the second pulse sequence type is a FISP pulse sequence.

13. The system according to claim 11, wherein the first pulse sequence type is a FLASH pulse sequence and the second pulse sequence type is a TrueFISP pulse sequence.

14. The system according to claim 11, wherein the first pulse sequence type is a FISP pulse sequence and the second pulse sequence type is a FLASH pulse sequence.

15. The system according to claim 11, wherein the computer system is further programmed to acquire a third plurality of MR image datasets using a third pulse sequence type during a third stage, wherein the third pulse sequence type is a different pulse sequence type than the first pulse sequence type and the second pulse sequence type and uses the constant repetition time of the first pulse sequence type and the second pulse sequence type.

16. The system according to claim 15, wherein the first pulse sequence type is a FISP pulse sequence, the second pulse sequence type is a TrueFISP pulse sequence and the third pulse sequence type is a FLASH pulse sequence.

17. The method according to claim 1, wherein the first pulse sequence type is a TrueFISP pulse sequence and the second pulse sequence type is a FISP pulse sequence.

18. The method according to claim 1, wherein the first pulse sequence type is a FISP pulse sequence and the second pulse sequence type is a TrueFISP pulse sequence.

19. The system according to claim 11, wherein the first pulse sequence type is a TrueFISP pulse sequence and the second pulse sequence type is a FISP pulse sequence.

20. The system according to claim 11, wherein the first pulse sequence type is a FISP pulse sequence and the second pulse sequence type is a TrueFISP pulse sequence.

* * * * *

UNITED STATES PATENT AND TRADEMARK OFFICE
CERTIFICATE OF CORRECTION

PATENT NO. : 11,373,392 B2
APPLICATION NO. : 16/378166
DATED : June 28, 2022
INVENTOR(S) : Mathias Nittka et al.

It is certified that error appears in the above-identified patent and that said Letters Patent is hereby corrected as shown below:

In the Specification

Column 1, Line 27, "("MM")" should be --("MRI")--.

Column 5, Line 44, "Mill" should be --MRI--.

Column 9, Line 53, "(q)+360°)" should be --(φ+360°)--.

Signed and Sealed this
Third Day of September, 2024

Katherine Kelly Vidal
*Director of the United States Patent and Trademark Office*